United States Patent
Kim et al.

(10) Patent No.: US 8,559,539 B2
(45) Date of Patent: Oct. 15, 2013

(54) METHOD, APPARATUS AND COMPUTER READABLE STORAGE MEDIUM

(75) Inventors: Kyeong Jin Kim, Irving, TX (US); Padam Kafle, Coppell, TX (US)

(73) Assignee: Nokia Corporation, Espoo (FI)

( * ) Notice: Subject to any disclaimer, the term of this patent is extended or adjusted under 35 U.S.C. 154(b) by 1117 days.

(21) Appl. No.: 12/492,780

(22) Filed: Jun. 26, 2009

(65) Prior Publication Data

US 2010/0329308 A1  Dec. 30, 2010

(51) Int. Cl.
*H04L 5/12* (2006.01)

(52) U.S. Cl.
USPC ............. 375/265; 375/240; 341/52; 341/102

(58) Field of Classification Search
USPC ......... 375/140, 146, 240, 260, 265, 278, 284, 375/285, 295, 296; 341/50, 51, 52, 102, 341/103
See application file for complete search history.

(56) References Cited

U.S. PATENT DOCUMENTS

| | | | | |
|---|---|---|---|---|
| 8,127,197 B2* | 2/2012 | Frank et al. | | 714/755 |
| 8,180,314 B2* | 5/2012 | Kim | | 455/338 |
| 2008/0298435 A1* | 12/2008 | Lakkis | | 375/140 |
| 2009/0097580 A1* | 4/2009 | Bang et al. | | 375/260 |
| 2009/0323587 A1* | 12/2009 | Trachewsky et al. | | 370/328 |
| 2010/0061320 A1* | 3/2010 | Lakkis | | 370/329 |
| 2010/0166103 A1* | 7/2010 | Harel et al. | | 375/295 |

OTHER PUBLICATIONS

Kyeong Jin Kim and Padam Kafle, "SC Header Encoding and Modulation Text", WGA Contribution by Nokia, Apr. 23, 2009, 2 pages.

* cited by examiner

*Primary Examiner* — Dac Ha
(74) *Attorney, Agent, or Firm* — Banner & Witcoff, Ltd.

(57) ABSTRACT

Embodiments of the invention relate to a method, apparatus and computer readable storage medium wherein the method comprises; padding a data block of a data structure to enable encoding of the data block; encoding the data block; reducing the size of the encoded data block; and spreading the data block.

20 Claims, 4 Drawing Sheets

METHOD, APPARATUS AND COMPUTER READABLE STORAGE MEDIUM

FIELD OF THE INVENTION

Embodiments of the present invention relate to a method, apparatus and computer readable storage medium. In particular, they relate to a method, apparatus and computer readable storage medium for coding, modulation and spreading of data

BACKGROUND TO THE INVENTION

The 60 GHz millimeter wave band may be used for applications such as wireless high-definition multimedia interface (HDMI), gaming interfaces and high-speed back-haul and content distribution services.

Due to very high path losses in the 60 GHZ band, robust encoding of the header field of transmitted data structures is required.

BRIEF DESCRIPTION OF VARIOUS EMBODIMENTS OF THE INVENTION

According to various, but not necessarily all, embodiments of the invention there is provided a method comprising; padding a data block of a data structure to enable encoding of the data block; encoding the data block; reducing the size of the encoded data block; and spreading the data block.

In some embodiments of the invention the data block may be a header of a data structure.

In some embodiments of the invention the bits of the data block may be scrambled before padding. The scrambling may comprise XORing the input bits with a scrambling sequence generated from a known linear feedback shift register.

In some embodiments of the invention the padding may comprise adding redundant data to the data block. In some embodiments of the invention the padding may comprise zeros padding.

In some embodiments of the invention the padded data block may comprise only the data block and the padded zeros.

In some embodiments of the invention the same encoding may be used for both the data block and a further data portion of the data structure.

In some embodiments of the invention the encoding may comprise low density parity check encoding.

In some embodiments of the invention the size of the encoded data block may be reduced by removing the padded zeros.

In some embodiments of the invention the data block may be modulated before spreading.

In some embodiments of the invention binary phase shift keying modulation may be used to modulate the data block. In some embodiments of the invention, the modulated symbols are phase rotated by pi/2 phase shifts.

In some embodiments of the invention the spreading may be by a factor of two.

In some embodiments of the invention the data block may be transmitted using a 60 GHz frequency carrier signal.

According to various, but not necessarily all, embodiments of the invention there is provided an apparatus comprising; a padding portion configured to pad a data block of a data structure to enable encoding of the data block; an encoder configured to encode the data block; a shortening portion configured to reduce the size of the data block after encoding; and a spreader for spreading the reduced data block.

In some embodiments of the invention the data block may be a header of a data structure.

In some embodiments of the invention the apparatus comprises a scrambler configured to scramble the bits of the data block before padding. The scrambler may be configured to scramble the bits of the data block by XORing the input bits with a scrambling sequence generated from a known linear feedback shift register.

In some embodiments of the invention the padding portion may be configured to pad the data block by adding redundant data to the data block. In some embodiments of the invention the padding portion may be configured to pad the data block using zeros padding.

In some embodiments of the invention the padded data block may comprise only the data block and the padded zeros.

In some embodiments of the invention the encoder may comprise a low density parity check encoder.

In some embodiments of the invention the shortening portion may be configured to reduce the size of the encoded data block by removing the padded zeros.

In some embodiments of the invention the apparatus may comprise a modulator for modulating the data block.

In some embodiments of the invention the modulator may be a binary phase shift keying modulator. In some embodiments of the invention, the modulated symbols are phase rotated by pi/2 phase shifts.

In some embodiments of the invention the spreader may be configured to spread the data block by a factor of two.

In some embodiments of the invention the apparatus may comprise a transmitter for transmitting the data block using a 60-GHz frequency carrier signal.

The apparatus may be for wireless communication. In particular the apparatus may be for providing a signal for transmitting data using a wireless communication link.

According to various, but not necessarily all, embodiments of the invention there is provided a computer-readable storage medium encoded with instructions that, when executed by a processor enable; padding a data block of a data structure to enable encoding of the data block; encoding the data block; reducing the size of the encoded data block; and spreading the data block.

In some embodiments of the invention there may be provided a computer program comprising program instructions for causing a computer to perform the method of claim 1.

According to various, but not necessarily all, embodiments of the invention there is provided a method comprising: receiving a data block of a data structure; despreading the received data block; increasing the size of the data block after despreading; decoding the data block.

In some embodiments of the invention the despreading may comprise soft combining.

In some embodiments of the invention the size of the data block may be increased by inserting additional data to the data block after despreading.

In some embodiments of the invention the redundant data added after despreading may correspond to the soft bit values in the form of log-likelihood ratios computed for the known redundant data or zeros added to the data block before the data block was encoded.

In some embodiments of the invention the decoding used may be low density parity check decoding.

According to various, but not necessarily all, embodiments of the invention there is provided a computer-readable storage medium encoded with instructions that, when executed by a processor enable; receiving a data block of a data structure; despreading the received data block; increasing the size of the data block after despreading; decoding the data block.

According to various, but not necessarily all, embodiments of the invention there is provided an apparatus comprising; a receiver configured to receive a data block of a data structure; a despreader for despreading the received data block; a portion configured to insert additional information to the data block after despreading; and a decoder configured to decode the data block.

In some embodiments of the invention the decoder may be a low density parity check decoder.

The apparatus may be for wireless communication. In particular the apparatus may be for receiving a signal for transmitting data using a wireless communication link.

According to various, but not necessarily all, embodiments of the invention there is provided a method comprising; concatenating zeros to a header of a data structure; creating a low density parity check codeword by generating parity bits for the header; removing bits of the codeword to create a reduced length codeword; modulating the reduced length codeword; and spreading the modulated codeword.

In some embodiments of the invention the parity bits may be generated using a parity check matrix for a rate 3/4 low density parity check code.

In some embodiments of the invention the reduced length codeword may be modulated using pi/2 binary phase shift key modulation.

In some embodiments of the invention the spreading may be by a factor of two.

According to various, but not necessarily all, embodiments of the invention there is provided an apparatus comprising; a padding portion configured to concatenate zeros to a header of a data structure; an encoder configured to create a low density parity check codeword by generating parity bits for the header; a shortening portion configured to remove bits of the codeword to create a reduced length codeword; a modulator configured to modulate the reduced length codeword; and a spreader configured to spread the modulated codeword.

In some embodiments of the invention the encoder may be configured to generate the parity bits using a parity check matrix for a rate 3/4 low density parity check code.

In some embodiments of the invention the modulator may be configured to modulate the reduced length codeword using pi/2 binary phase shift key modulation.

In some embodiments of the invention the spreader may be configured to spread the modulated codeword by a factor of two.

The apparatus may be for wireless communication. In particular the apparatus may be for providing a signal for transmitting data using a wireless communication link.

BRIEF DESCRIPTION OF THE DRAWINGS

For a better understanding of various examples of embodiments of the present invention reference will now be made by way of example only to the accompanying drawings in which.

DETAILED DESCRIPTION OF VARIOUS EMBODIMENTS OF THE INVENTION

Figure 1:
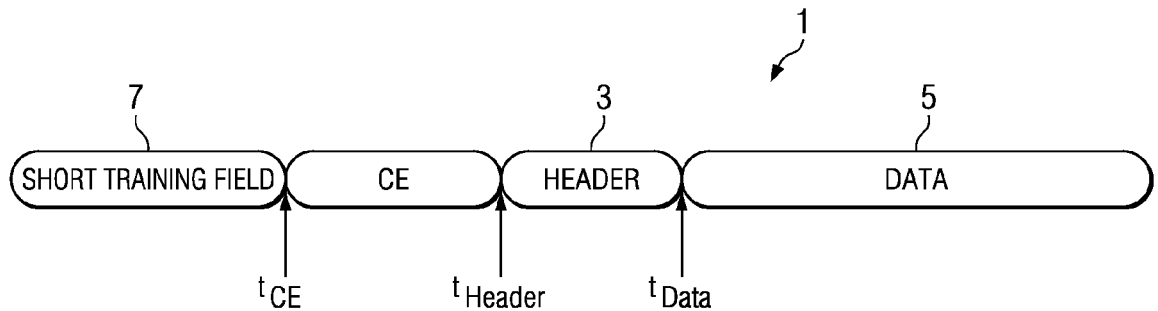
FIG. 1 illustrates a data packet structure which may be used in embodiments of the invention

The Figures illustrate a method comprising; padding 23 a data block of a data structure 1 to enable encoding 25 of the data block; encoding 25 the data block; reducing 27 the size of the encoded data block; and spreading 29 the data block.

In the following description, unless expressly stated otherwise, the words "connect" and "couple" and their derivatives mean operationally connected or operationally coupled. It is to be appreciated that any number or combination of intervening components can exist including no intervening components.

FIG. 1 illustrates a data structure 1 which may be encoded in embodiments of the invention. The data structure 1 comprises a plurality of data blocks. In the illustrated embodiment the data structure 1 is a packet structure comprising a preamble 7 followed by a header 3 followed by a payload data field 5.

The packet structure illustrated in FIG. 1 may be used to transmit data over a wireless communication link. For example, the illustrated packet structure may be used in a wireless local area network (WLAN) communication link. The frequency band used to transmit the packet structure may be a high frequency band such as the 60 GHz frequency band.

The header 3 may comprise a plurality of fields which define the details of the physical layer protocol data unit (PPDU) to be transmitted. For example the header 3 may define scrambler initialization, additional PPDU and length. As the header 3 defines information which is used to decode the payload data field 5 it is useful to enable the header 3 to be robustly encoded.

It is to be appreciated that in other embodiments of the invention different data structures may be used.

Figure 2:
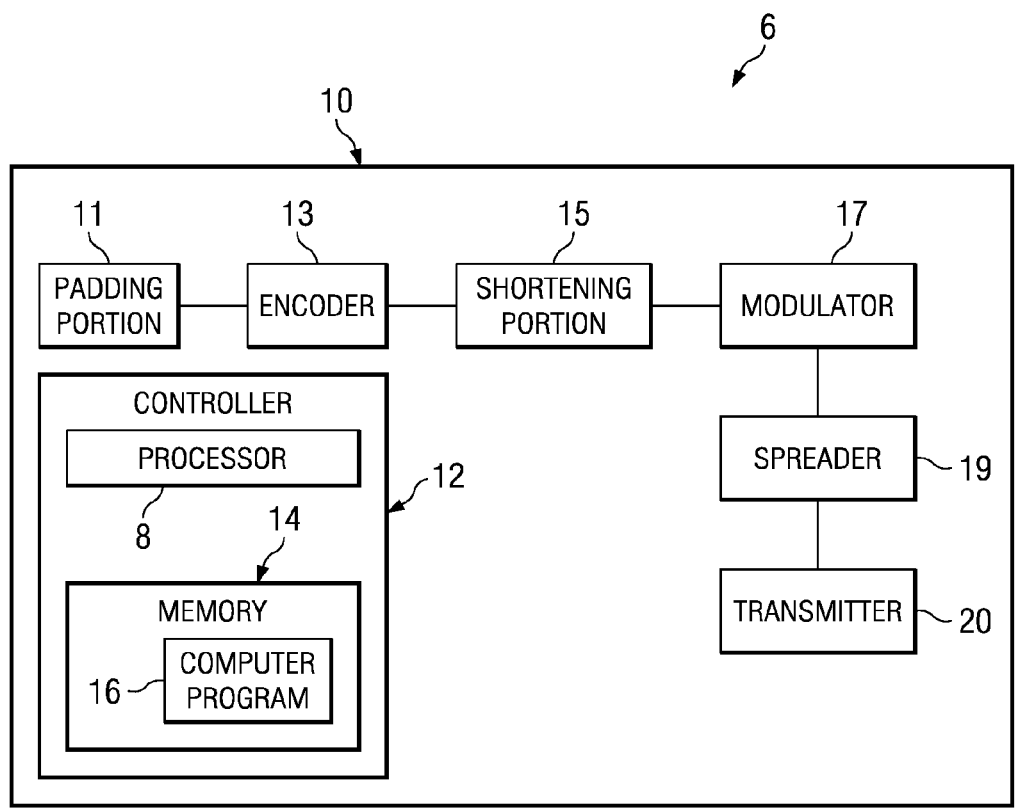
FIG. 2 is a schematic diagram of an apparatus according to embodiments of the invention.

FIG. 2 schematically illustrates an apparatus 10 according to an embodiment of the invention. The apparatus 10 illustrated in FIG. 1 comprises a padding portion 11, an encoder 13, a shortening portion 15, a modulator 17, a spreader 19 and a transmitter 20. In some embodiments of the invention the apparatus 10 may also comprise a controller 12. Only features referred to in the following description are illustrated. It should, however, be understood that the apparatus 10 may comprise additional features that are not illustrated.

The padding portion 11 may be any means which is configured to pad a data block of the data structure 1 so as to increase the number of bits in the data block. The padding portion 11 may comprise circuitry which enables the padding.

The padding portion 11 may be configured to pad the data block by adding redundant data to the data block. The redundant data may be any data which remains invariant after the data block has been encoded.

The padding may be for example, zeros padding in which zeros are added to the data block to increase the size of the data block. The zeros may be concatenated to the end of the data block. The number of zeros added may be such that after padding the data block has a standard size. For example, after padding the data block may be the same size as another data block in the data structure 1.

The padding portion 11 is coupled to an encoder 13 so that after the data block has been padded it may be provided to the encoder 13. The encoder 13 may be any means which is configured to encode the padded data block to create a codeword. The coding algorithm used by the encoder 13 may depend upon the length of the data block which is provided to the encoder 13. The coding algorithm used may also depend upon other factors such as the modulation which is to be applied to the data block, the data rate which is to be used and the type of channel which is used to transmit the data.

In some embodiments of the invention the encoder 13 may be a linear block code such as low density parity check code configured to create a codeword by generating parity check bits and adding these to the padded data block.

The encoder 13 is coupled to a shortening portion 15 so that after encoding the codeword is provided to the shortening portion 15.

The shortening portion 15 may comprise any means which is configured to enable the size of the codeword created by the encoder 13 to be reduced. For example the shortening portion 15 may comprise circuitry which removes the redundant data which was added to the data block before it was encoded thereby creating a shortened codeword. The redundant data does not need to be transmitted.

The shortening portion 15 is coupled to a modulator 17 so that the shortened codeword may be provided to the modulator 17. The modulator 17 may be any means which is configured to modulate the shortened codeword. It is to be appreciated that different types of modulation may be used in different embodiments of the invention. For example, in some embodiments of the invention pi/2 binary phase shift keying (BPSK) modulation may be used, which is BPSK modulation, followed by pi/2 phase shift rotation of the modulated symbols.

The modulator 17 is coupled to a spreader 19 so that the modulated codeword may be provided to the spreader 19. The spreader 19 may comprise any means which is configured to increase the size of the modulated codeword by spreading.

The spreader 19 may be configured to spread the modulated codeword by multiplying the modulated codeword with a spreading code so as to increase the number of symbols in the modulated codeword. The factor by which the spreading increases the size of the modulated codeword may depend upon factors such as the scheme which is used to transmit the codeword. For example where a single carrier scheme with block transmission is used, the spreading may increase the size of the modulated codeword so that it can be accommodated into one or more single carrier modulation blocks. Where a multi-carrier scheme such as OFDM (orthogonal frequency domain multiplexing) is used the spreading may increase the size of the modulated codeword to accommodate into the data carriers of one or more OFDM symbols.

The spreader 19 is coupled to a transmitter 20 so that after the codeword has been spread it may be provided to the transmitter 20 for transmission.

The transmitter 20 may comprise any means which enables the spread codeword to be transmitted. The transmitter 20 may be configured to transmit the data as a radio frequency signal via a wireless communications link. For example the transmitter 20 may be configured to transmit the codeword via a WLAN communication link. The wireless communications link may use a high frequency band such as the 60 GHz frequency band.

In some embodiments of the invention the apparatus 10 may also comprise a controller 12. The controller 12 may be configured to control the apparatus 10. The controller 12 may be implemented using instructions that enable hardware functionality, for example, by using executable computer program instructions 16 in a general-purpose or special-purpose processor 8 that may be stored on a computer readable storage medium 6 (e.g. disk, memory etc) to be executed by such a processor 8.

In some embodiments of the invention the controller 12 may comprise a processor 8 and a memory 14. The memory 14 may store a computer program comprising computer program instructions 16 that control the operation of the apparatus 10 when loaded into the processor 8. The computer program instructions 16 provide the logic and routines that enable the apparatus 10 to perform the methods illustrated in FIGS. 3 and 4. The processor 8 by reading the memory 14 is able to load and execute the computer program.

The computer program instructions 16 may provide computer readable program means for padding 23 a header of a data structure 1 to enable encoding 25 of the header; encoding 25 the header; reducing 27 the size of the encoded header; and spreading 31 the header.

The computer program may arrive at the apparatus 10 via any suitable delivery mechanism. The delivery mechanism may be, for example, a computer-readable storage medium 6, a computer program product, a memory device such as a flash memory, a record medium such as a CD-ROM or DVD, an article of manufacture that tangibly embodies the computer program. The delivery mechanism may be a signal configured to reliably transfer the computer program. The apparatus 10 may propagate or transmit the computer program as a computer data signal.

Although the memory 14 is illustrated as a single component it may be implemented as one or more separate components some or all of which may be integrated/removable and/or may provide permanent/semi-permanent/dynamic/cached storage.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (e.g. Von Neumann)/parallel architectures but also specialized circuits such as field-programmable gate arrays (FPGA), application specific integration circuits (ASIC), signal processing devices and other devices. References to computer program, instructions, code etc. should be understood to encompass software for a programmable processor or firmware such as, for example, the programmable content of a hardware device whether instructions for a processor, or configuration settings for a fixed-function device, gate array or programmable logic device.

Figure 3:
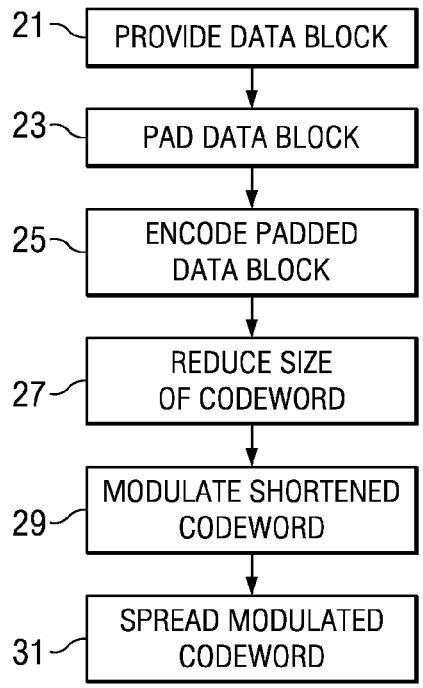
FIG. 3 is a block diagram of a method according to embodiments of the invention.

FIG. 3 is a block diagram which schematically illustrates a method according to embodiments of the invention.

At step 21 a data block is provided. The data block which is provided may be part of a data structure 1 such as the data structure illustrated in FIG. 1. The data block may be a short data block such as the header 3. It is to be appreciated that in other embodiments of the invention the data block may be any data portion of the data structure 1. For example it may be any small data packet or a portion of the payload data field 5.

The data block may comprise a first number of bits b. The data block may be first scrambled before padding by XORing the bits of the data block with a scrambling sequence generated from a known linear feedback shift register.

At block 23 the data block is padded to increase the length of the data block. The padding may increase the number of bits in the data block from b to q where q is greater than b.

The padding may be achieved by adding redundant data to the data block. The padding may be for example, zeros padding which comprises adding zeros to the end of the data block. The number of bits of redundant data added is r where r=q−b.

After the data block has been padded the number of bits q in the data block may equal the number of bits in another block of the data structure 1. For example, where the header 3 of data structure has been padded the payload data field 5 of the data structure 1 may also comprise q bits. That is, the padding may be configured to make the header 3 the same size as another data block in the data structure 1.

At block 25 the padded data block is encoded to create a codeword. The codeword may be created using any suitable encoding algorithm. The codeword may be created by generating parity check bits and adding these to the padded data block. The parity bits may be generated such that $Hc^T=0$ where H is a parity check matrix and c is the codeword consisting of the padded data block and the parity bits. The parity check matrix may be a low density parity check (LDPC) matrix.

The number of parity bits generated is p so the length of the codeword is q+p. Hence, the code rate used for encoding is q/(q+p).

The same encoding mechanism may be used to encode other data blocks in the data structure 1. For example, the same parity check matrix may also be used to generate parity bits for other data blocks such as the payload data field 5.

The data rate of the encoder may be high. For example the data rate of the encoder may be above 1/2. In the following examples the code used to encode the data block has a rate of 3/4. It is to be appreciated that other codes having other rates may be used. Using a high code rate keeps the number of parity bits generated low relative to the number of bits in the padded data block.

At block 27 the size of the codeword is reduced. The size of the codeword may be reduced by removing the redundant data which was added by padding from the codeword. For example where the length of the data block was increased by zeros padding the zeros may be removed from the codeword. That is, the r bits of redundant data are removed so the length of the shortened codeword is b+p.

Removing the redundant data decreases the effective code rate of the encoder. After the codeword has been shortened the data rate of the codeword may be less than 1/2. For example, after the r=q−b bits of redundant data are removed, the effective code rate is b/(b+p).

At block 29 the shortened codeword is modulated. The modulation used may be any suitable modulation. In some embodiments used the modulation may be BPSK modulation. In some embodiments used the modulation may be pi/2 BPSK modulation, in which the BPSK modulation is followed by pi/2 phase shift rotation of the modulated symbols.

At block 31 the spreading is applied to the modulated codeword. The spreading 31 increases the number of symbols in the modulated codeword by a factor n so that the total number of symbols in the block after spreading is given by n(b+p).

As mentioned above, the factor n by which the spreading increases the size of the modulated codeword may depend upon the scheme which is used to transmit the codeword. For example where a single carrier scheme with block transmission is used, the spreading may increase the size of the modulated codeword to be accommodated into a one single carrier modulation block. Where a multi-carrier scheme such as OFDM is used the spreading may increase the size of the modulated code word to accommodate it into the data carriers of one or more OFDM symbols.

Figure 4:
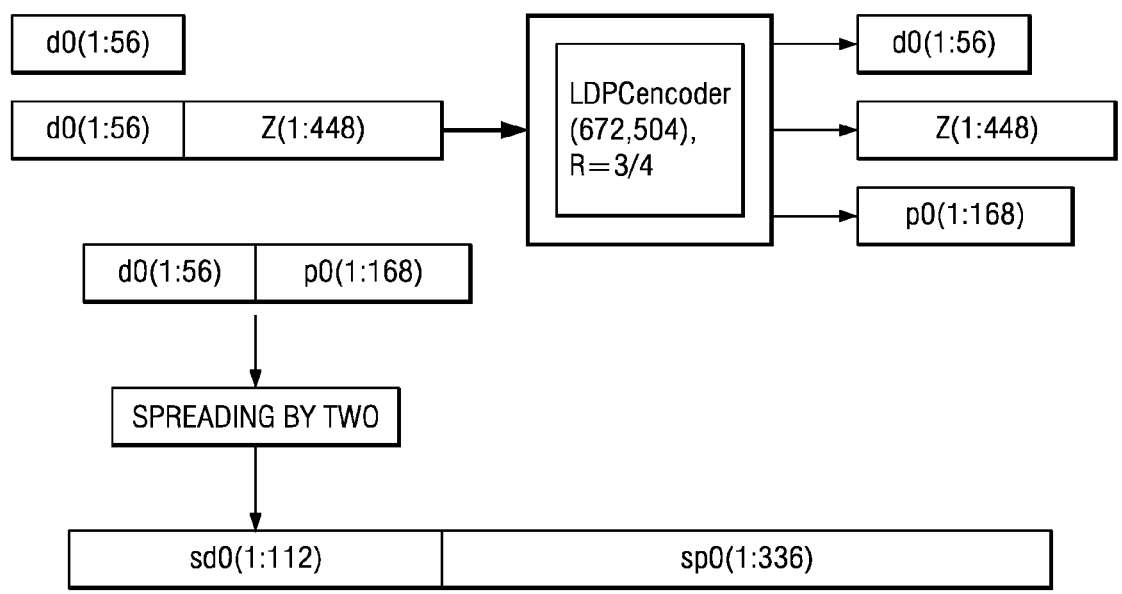
FIG. 4 schematically illustrates an embodiment of the invention.

FIG. 4 illustrates a method according to a first embodiment of the invention. An information block d0(1:56) is zeros padded to construct an input block of 504 bits. We then apply a rate 3/4 low density parity check (LDPC) encoder of block size (672, 504) to generate coded information block (d0(1:56), z(1:48), p0(1:168)). To satisfy the length for the LDPC encoder, we add 448 zeros denoted by z(1:448) after the information block d0(1:56). This will result in the equivalent rate 1/4 code of block size (224, 56). After BPSK modulation, spreading is applied. To support one single carrier modulation block of 448 bits, we use spreading by a factor of 2 and the transmit symbols corresponding to [d0(1:560), p0(1:168), d1(1:56), p1(1:168)], in which the d1(1;56), p1(1:168) corresponds to the symbols obtained by spreading.

In some embodiments of the invention the data block may be a header field. In such embodiments of the invention the header may be encoded as follows.

The header will be encoded using a single SCM block of N_CBPB symbols with N_GI guard symbols. The bits are scrambled and encoded as follows:

The input header bits $(b_1, b_2, \ldots, b_{LH})$ where LH=56 are scrambled, using a known scrambling sequence generated from a 7-bit long linear feedback shift register, starting from the eighth bit to create $d_{1s}=(q_1, q_2, \ldots, q_{LH})$.

The LDPC codeword $c=(q_1, q_2, \ldots, q_{LH}, 0, 0, \ldots, 0, p_1, p_2, \ldots, p_{168})$ is created by concatenating 504—LH zeros to the LH bits of $d_{1s}$ and then generating the parity bits $p_1, p_2, \ldots, p_{168}$ such that $Hc^T=0$, where H is the parity check matrix for the rate 3/4 LDPC code.

Remove bits LH+1 through 504 of the codeword c to create the codeword cs. The resulting 224 bits are then mapped as pi/2-BPSK.

The 224 constellation points after pi/2 BPSK modulation, $(s_1, s_2, \ldots, s_{224})$ are then spread by a factor of 2, to generate 448 symbols $(s_1, s_2, \ldots, s_{224}, s_{225}, s_{226}, \ldots, s_{448})$ such that $s_{k+224}=-s_k$, for k=1, 2, ..., 224. The N_GI-length guard symbols are then prepended to the resulting N_CBPB symbols, where N_GI=64 and N_CBPB=448.

Figure 5:
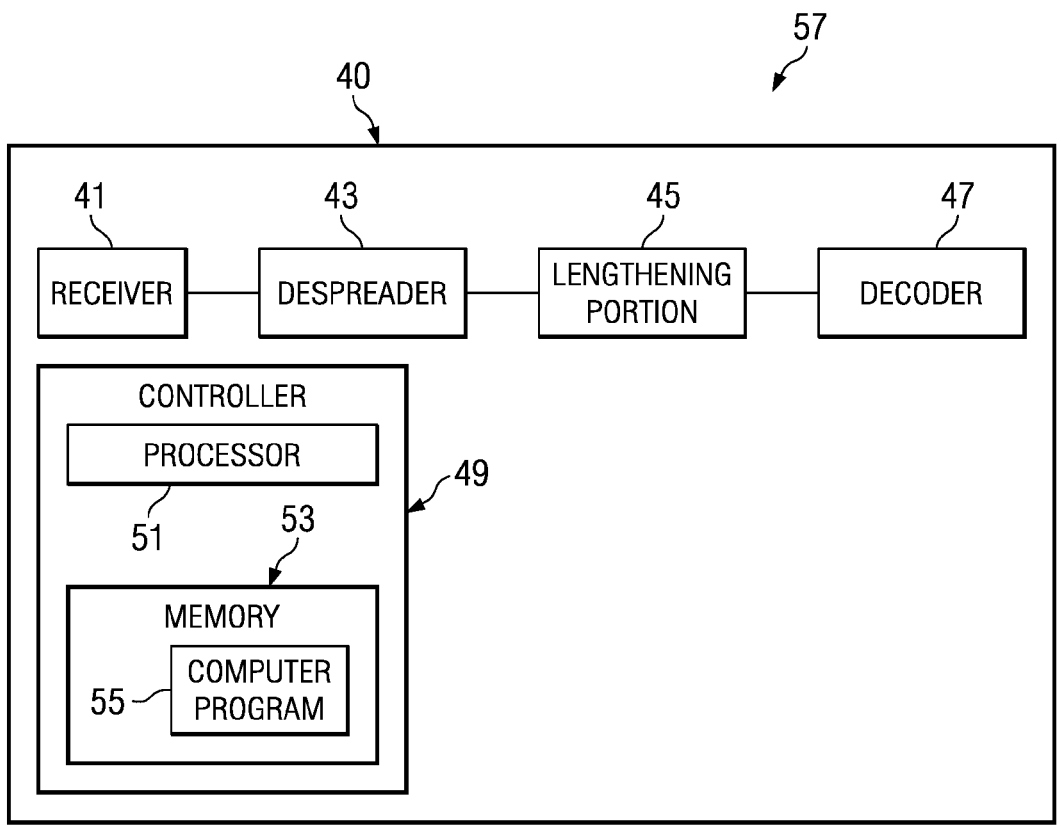
FIG. 5 is a schematic diagram of another apparatus according to embodiments of the invention.

FIG. 5 schematically illustrates another apparatus 40 according to an embodiment of the invention. The apparatus 40 illustrated in FIG. 5 comprises a receiver 41, a despreader 43, a padding portion 45 and a decoder 47. In some embodiments of the invention the apparatus 40 may also comprise a controller 49. Only features referred to in the following description are illustrated. It should, however, be understood that the apparatus 40 may comprise additional features that are not illustrated.

The receiver 41 may comprise any means which enables the apparatus 40 to receive a signal such as a radio frequency communication signal. The received signal may be received from another apparatus such as the apparatus 10 illustrated in FIG. 2 and described above.

The receiver 41 may be configured to receive signals via a wireless communications link. For example the receiver 41 may be configured to receive the data via a WLAN communication link. The wireless communications link may use a high frequency band such as the 60 GHz frequency band.

The receiver 41 is coupled to the despreader 43 so that after the data has been received it may be provided to the despreader 43. The despreader 43 may comprise any means which is configured to combine data symbols. The data symbols may have been received by the receiver 41, which may have been demodulated by the receiver 41 to provide soft outputs in the form of log-likelihood ratios (LLR). Any suitable method of combining the symbols may be used. For example, in the embodiments of the invention described below soft combining of the soft outputs from the demodulator is used.

The despreader 43 is coupled to a padding portion 45. The padding portion 45 may comprise any means which is configured to increase the number of symbols in a block of symbols. The symbols at the despreader 43 and the padding portion 45 may be in the form of soft bit values, such as LLRs. The added symbols may correspond to the redundant data which was added to a data block by the apparatus 10 before the data block was encoded and transmitted. The number of symbols added by the padding portion may correspond to the number of bits of redundant data added.

The padding portion 45 and the despreader 43 are coupled to a decoder 47 so that the decoder may decode both the received symbols and the symbols added by the padding portion 45. The decoder 47 may be any means which is configured to decode the symbols. The decoding algorithm used by the decoder 47 may depend upon the number of bits in the block of symbols which is provided to the decoder 47.

In some embodiments of the invention the apparatus 40 may also comprise a controller 49. The controller 49 may be configured to control the apparatus 10. The controller 49 may be implemented using instructions that enable hardware functionality, for example, by using executable computer program instructions 55 in a general-purpose or special-purpose processor 51 that may be stored on a computer readable storage medium 57 (e.g. disk, memory etc) to be executed by such a processor 51.

In some embodiments of the invention the controller 49 may comprise a processor 51 and a memory 53. The memory 53 may store a computer program comprising computer program instructions 55 that control the operation of the apparatus 40 when loaded into the processor 51. The computer program instructions 57 provide the logic and routines that enable the apparatus 40 to perform the methods illustrated in FIGS. 6 and 7. The processor 51 by reading the memory 53 is able to load and execute the computer program.

The computer program instructions 55 may provide computer readable program means for receiving a header 3 of a data structure 1; despreading the received header 3; increasing the size of the header 3; decoding the header 3.

The computer program may arrive at the apparatus 40 via any suitable delivery mechanism. The delivery mechanism may be, for example, a computer-readable storage medium 6, a computer program product, a memory device such as a flash memory, a record medium such as a CD-ROM or DVD, an article of manufacture that tangibly embodies the computer program. The delivery mechanism may be a signal configured to reliably transfer the computer program. The apparatus 40 may propagate or transmit the computer program as a computer data signal.

Although the memory 53 is illustrated as a single component it may be implemented as one or more separate components some or all of which may be integrated/removable and/or may provide permanent/semi-permanent/dynamic/cached storage.

Figure 6:
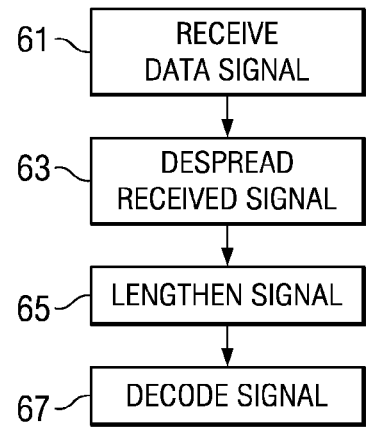
FIG. 6 is a block diagram of a method according to embodiments of the invention.
Figure 7:
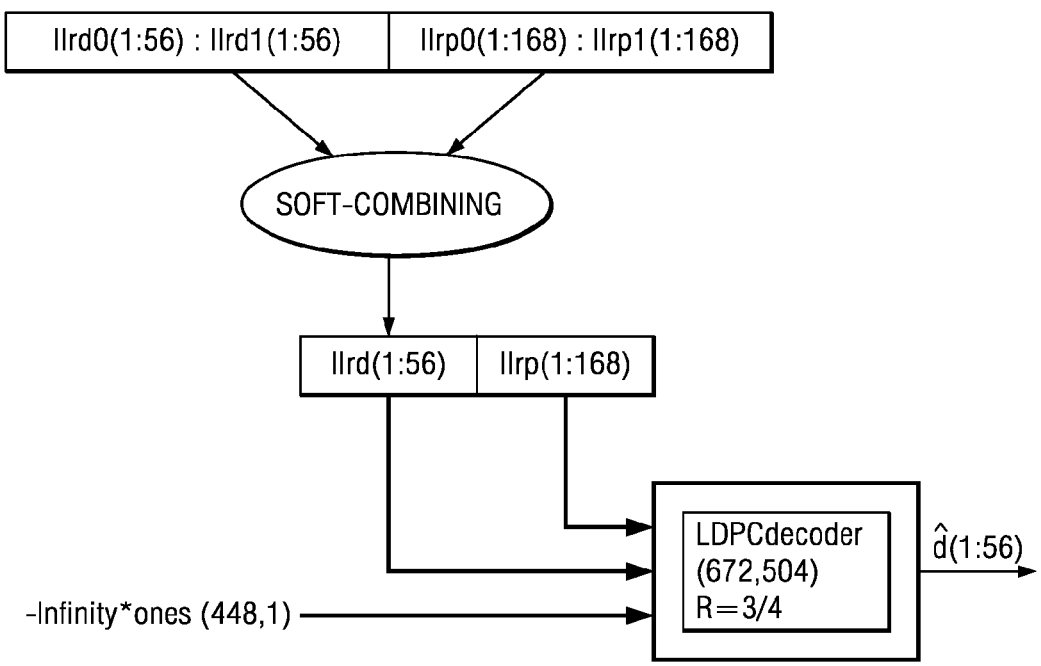
FIG. 7 schematically illustrates another embodiment of the invention.

FIG. 6 is a block diagram which schematically illustrates a method according to embodiments of the invention.

At block 61 a radio signal is received by the receiver 41. The radio signal may have been transmitted by an apparatus 10 such as the apparatus to illustrated in FIG. 2.

The received radio signal may comprise a block of symbols. The block of symbols may correspond to a data block which has been encoded and transmitted in accordance with the embodiments of the invention described above. The number of symbols in the block may correspond to the number of symbols in the block before it is transmitted. The number of symbols in the block may be n(b+p) where n is the spreading factor, b is the number of bits in the original data block and p is the number of parity bits which were generated when the code word was created. The received block of data symbols may be the header 3 of a data structure 1.

The demodulated soft outputs in the form of log likelihood ratios (LLR) are obtained for each of the received symbols to provide a block of LLRs. As an LLR is obtained for each symbol received the number of LLRs in the block is still n(b+p).

At block 63 despreading is applied to the block of LLRs. The despreading may be any mechanism which enables the symbols of the radio signal to be combined. In the following exemplary embodiment of the invention soft combining may be used.

The despreading reduces the number of symbols in the block. The number of symbols in the block is decreased by the factor n so the number of LLRs in the block after despreading is b+p.

At block 65 padding is applied. The padding increases the number of LLRs in the block by adding the LLRs of redundant data to the block. The redundant LLRs added may correspond the redundant data which was added before the data block was encoded and transmitted. For example, where the data block was padded using zeros padding the LLRs added may correspond to the LLRs of the zeros.

Also the number of LLRs added to the block may be equal to the number of redundant bits of data which were added to the data block before it was encoded. That is r LLRs may be added to the block so that the total number of symbols in the block is q+p where q=b+r At block 67 the symbols are decoded. Any suitable mechanism may be used to decode the symbols. For example LDPC decoding may be used.

The rate of the decoding algorithm used may correspond to the rate of the encoding algorithm used by the encoder. The same decoding algorithm may also be used to decode other data blocks of the data structure, for example the decoding mechanism may also be used to decode a payload data field 5.

FIG. 6 illustrates a method according to embodiments of the invention. After passing over a channel and a demodulator, such as a frequency domain equalizer, we obtain llrd0(1:56) and llrd1(1:56) for the original information symbols and spread information symbols respectively. Similarly, the llrp0 (168) and llrp(1:168) for paritys corresponding to original parity symbols and spread parity symbols. The LLRs are soft combined and only a set of llrd(1:56) and llrp(1:168) are obtained. Then after using known LLR for zeros padded at the transmitter, the LDPC decoding is carried out by the rate 3/4 LDPC decoder of block size (672, 504). Due to the use of the equivalent rate 1/4 code before spreading and spreading after this results in an equivalent rate of 1/8 code with the same block size constraint. The performance improvement is due to the result of low rate 1/4 encoding after shortening even though while using original rate 3/4 code, and due to the spreading operation, that allows LLR soft combining at the receiver before decoding.

Embodiments of the invention as described above provide a method for robustly encoding short data blocks such as headers 3. Embodiments of the invention enable the same coding algorithm to be used for blocks of different sizes. This means that it is not necessary for the apparatus 10 to comprise a different encoder for different sized blocks. Also the same decoder may be used to decode different sized blocks.

The use of padding before the encoding and shortening after the encoding creates a codeword with a low data rate.

The data rate may be decreased even further by the spreading. This reduces the error rate in the transmitted signal. as can be seen in FIGS. 8 and 9.

Figure 8:
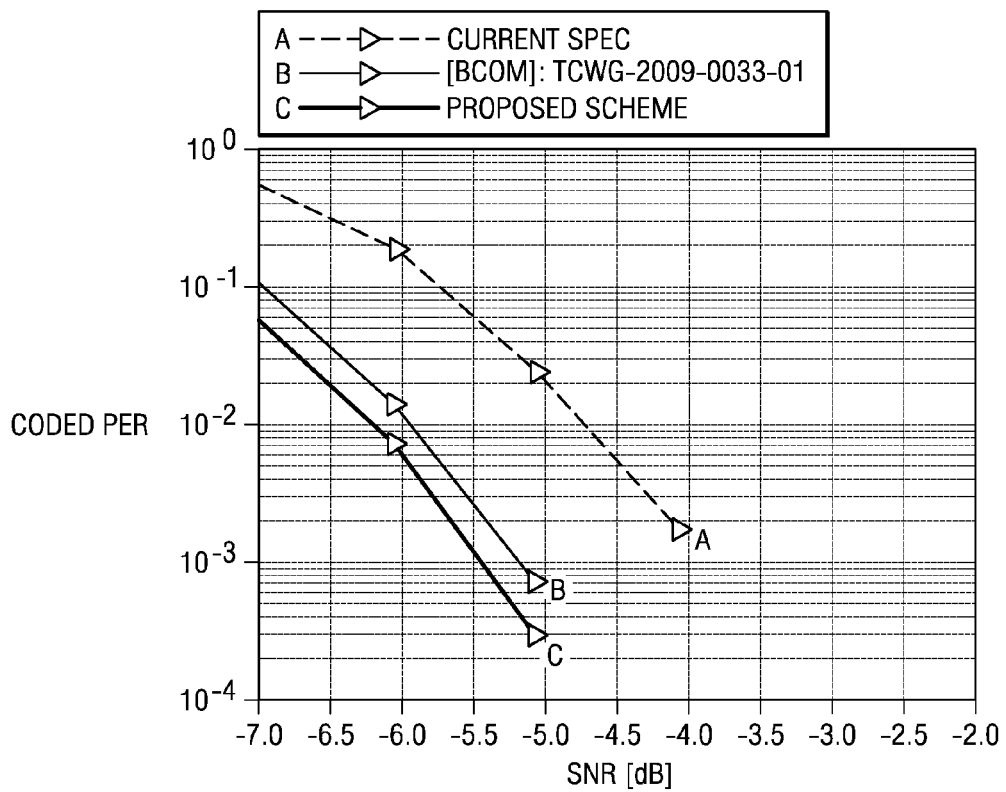
FIG. 8 is a plot of packet error rate vs signal noise ratio for an embodiment of the invention using an AWGN (Additive White Gaussian Noise) channel.

FIG. 8 is a plot of packet error rate vs signal noise ratio for an embodiment of the invention using an AWGN (Additive White Gaussian Noise) channel. The data block used had a size of 56 input bits, the waveform used was single carrier and the modulation used was BPSK.

Figure 9:
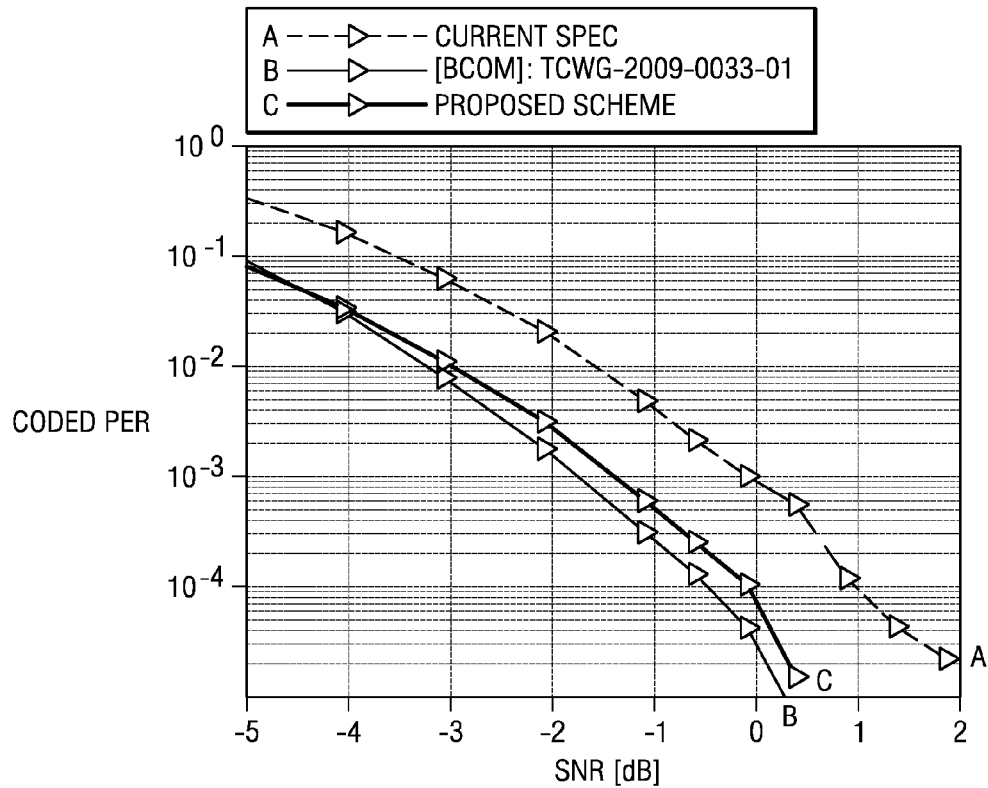
FIG. 9 is a plot of packet error rate vs signal noise ratio for an embodiment of the invention using a Rayleigh fading channel.

FIG. 9 is a plot of packet error rate vs signal noise ratio for an embodiment of the invention using a Rayleigh fading channel with RMS (root mean square) delay spread of 3 ns. The data block used had a size of 56 input bits, the waveform used was single carrier and the modulation used was BPSK.

It can be seen from FIGS. 8 and 9 that embodiments of the present invention provide an improved error rate compared to currently proposed encoding mechanisms.

The blocks illustrated in the FIGS. 3 and 6 may represent steps in a method and/or sections of code in the computer program 16, 55. The illustration of a particular order to the blocks does not necessarily imply that there is a required or preferred order for the blocks and the order and arrangement of the block may be varied. Furthermore, it may be possible for some steps to be omitted. For example in FIG. 3 the spreading may be applied before the modulation in some embodiments of the invention.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

The invention claimed is:

1. A method comprising:
padding a data block of a data structure to form a padded data block;
encoding the padded data block with an encoding algorithm to produce an encoded data block having a first code rate;
reducing a size of the encoded data block to produce a reduced encoded data block having a second code rate lower than the first code rate; and
spreading the reduced encoded data block to produce a modified encoded data block.

2. The method as claimed in claim 1 wherein the padding comprises adding at least one of redundant data or zeros to the data block.

3. The method as claimed in claim 1 wherein the encoding comprises low density parity check encoding.

4. The method as claimed in claim 1 wherein the size of the encoded data block is reduced by removing padded data added to the data block during the padding.

5. The method as claimed in claim 1, further comprising:
modulating the reduced encoded data block before the spreading, wherein the spreading includes spreading the modulated reduced encoded data block, and wherein binary phase shift keying modulation is used to modulate the reduced encoded data block and modulated symbols for the reduced encoded data block are phase rotated by pi/2.

6. The method as claimed in claim 1 wherein the spreading is-based on a factor calculated based on a transmission scheme for the data block, wherein the transmission scheme for the data block is one of multi-carrier and single carrier.

7. The method as claimed in claim 1 wherein the modified encoded data block and the encoded data block have a block size constraint that is the same.

8. The method as claimed in claim 1 wherein the modified encoded data block has a third code rate lower than the second code rate.

9. An apparatus comprising:
a padding circuit configured to pad a data block of a data structure to form a padded data block;
an encoder configured to encode the padded data block with an encoding algorithm to produce an encoded data block having a first code rate;
a shortening circuit configured to reduce a size of the data block after encoding to produce a reduced encoded data block having a second code rate lower than the first code rate; and
a spreader configured to spread the reduced encoded data block to produce a modified encoded data block.

10. The apparatus as claimed in claim 9 wherein the padding circuit is configured to pad the data block by adding at least one of redundant data or zeros to the data block.

11. The apparatus as claimed in claim 9 wherein the encoder comprises a low density parity check encoder.

12. The apparatus as claimed in claim 9 wherein the encoder is configured to encode a further data block of the data structure to produce an encoded further data block, wherein the apparatus further comprises a transmitter configured to transmit the modified encoded data block and encoded further data block, and wherein the modified encoded data block and encoded further data block are transmitted such that the data block is transmitted with a lower code rate than the further data block.

13. The apparatus as claimed in claim 9 wherein the shortening circuit is configured to reduce the size of the encoded data block by removing padded data added to the data block by the padding circuit.

14. The apparatus as claimed in claim 9 comprising a modulator for modulating the data block into modulated symbols.

15. The apparatus as claimed in claim 14 wherein the modulator is a binary phase shift keying modulator and is configured to rotate the modulated symbols by pi/2.

16. The apparatus as claimed in claim 9 wherein the spreader is configured to spread the reduced encoded data block based on a factor calculated based on a transmission scheme for the data block, wherein the transmission scheme for the data block is one of multi-carrier and single carrier.

17. The apparatus as claimed in claim 9 comprising a transmitter for transmitting the data block using a 60 GHz frequency carrier signal.

18. a non-transitory computer-readable storage medium encoded with instructions that, when executed by a processor enable:
padding a data block of a data structure to form a padded data block;

encoding the padded data block with an encoding algorithm to produce an encoded data block having a first code rate;

reducing a size of the encoded data block to produce a reduced encoded data block having a second code rate lower than the first code rate; and spreading the reduced encoded data block to produce a modified encoded data block.

19. An apparatus comprising:

a padding circuit configured to concatenate zeros to a header of a data structure to form a padded header;

an encoder configured to create a low density parity check codeword by generating parity bits for the padded header, wherein the codeword has a first code rate;

a shortening circuit configured to remove bits of the codeword to create a reduced length codeword having a second code rate lower than the first code rate;

a modulator configured to modulate the reduced length codeword to form a modulated codeword; and a spreader configured to spread the modulated codeword to produce a modified codeword.

20. The apparatus as claimed in claim 19 wherein the spreader is configured to spread the modulated codeword based on a factor calculated based on a transmission scheme for the modulated codeword, wherein the transmission scheme for the modulated codeword is one of multi-carrier and single carrier.

* * * * *